United States Patent [19]
Pferd et al.

[11] 4,307,377
[45] Dec. 22, 1981

[54] VECTOR CODING OF COMPUTER GRAPHICS MATERIAL

[75] Inventors: William Pferd, Mendham; Krishan Ramachandran, Edison, both of N.J.

[73] Assignee: Bell Telephone Laboratories, Incorporated, Murray Hill, N.J.

[21] Appl. No.: 92,942

[22] Filed: Nov. 9, 1979

[51] Int. Cl.³ .............................................. G06K 9/46
[52] U.S. Cl. ................ 340/146.3 AE; 340/146.3 AC; 358/260; 364/523
[58] Field of Search ............. 340/146.3 AE, 146.3 H, 340/146.3 AC; 364/523; 358/260–262

[56] References Cited

U.S. PATENT DOCUMENTS

| | | | |
|---|---|---|---|
| 3,576,980 | 5/1971 | Doyle | 340/146.3 AE |
| 4,087,788 | 5/1978 | Johannesson | 340/146.3 AE |
| 4,107,648 | 8/1978 | Frank | 340/146.3 H |
| 4,124,871 | 11/1978 | Morrin | 340/146.3 AE |
| 4,183,013 | 1/1980 | Agrawala et al. | 340/146.3 AC |
| 4,199,815 | 4/1980 | Kyte et al. | 364/523 |

OTHER PUBLICATIONS

Grimsdale et al., "A System for the Automatic Rec. of Patterns", *Proc. of I.E.E.*, vol. 106, Pt. B, No. 26, Mar., 1959, pp. 210–221.
Pferd et al., "Computer Aided Automatic Digitizing of Eng. Dwgs.", *Proc. 2nd Int'l Computer Software & App. Conf.*, Nov. 13–16, 1978, pp.630–635.

*Primary Examiner*—Leo H. Boudreau
*Attorney, Agent, or Firm*—Joseph P. Kearns

[57] ABSTRACT

Computer graphics material after raster scanning and digitizing is examined for linear narrow width areas of like light value, typically black or white. Runs of like value on successive scan lines are compared for contiguity and, when found, are compactly coded by coordinates of first and last scan lines defining each area and thickness. Data compaction ratios up to 36 to 1, as compared to the amount of data required to store data for every picture element, can be achieved in real time.

9 Claims, 10 Drawing Figures

FIG. 2
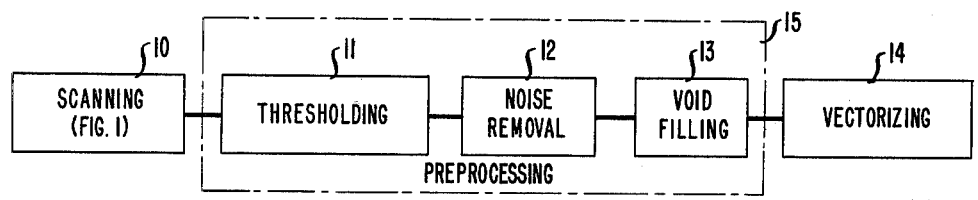
FIG. 3
INPUT:  0 0 0 0 1 1 1 0 0 0 1 1 0 0 0 1 0 0 0
OUTPUT: 0 0 0 0 1 1 1 0 0 0 0 0 0 0 0 0 0 0 0
FIG. 4
INPUT:  0 0 0 0 1 1 1 0 0 1 1 1 1 0 1 1 1 0 0
OUTPUT: 0 0 0 0 1 1 1 1 1 1 1 1 1 1 1 1 1 0 0
FIG. 5
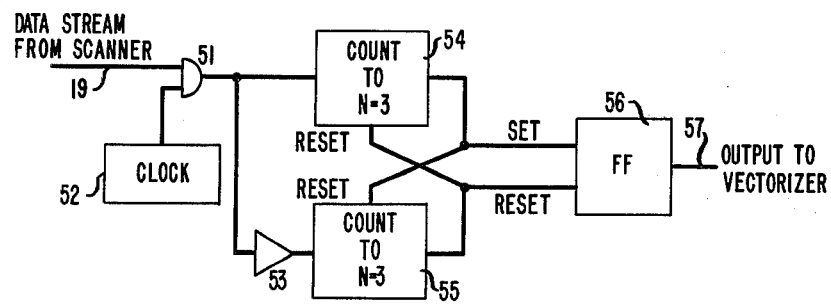
FIG. 6
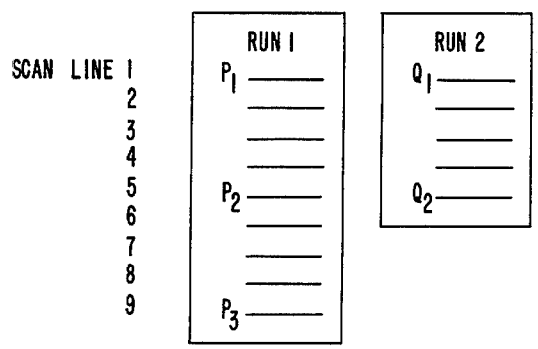

FIG. 8
FIG. 7
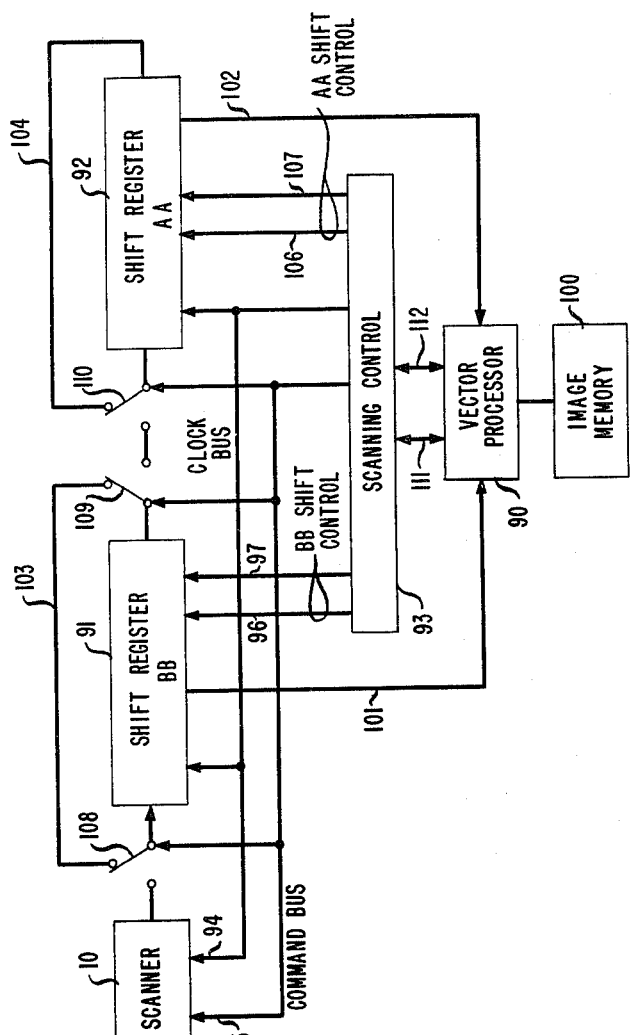
FIG. 9

VECTOR CODING OF COMPUTER GRAPHICS MATERIAL

BACKGROUND OF THE INVENTION

1. Field of the Invention

This invention relates to apparatus and method for coding of graphic information to facilitate editing, storing and transmitting such information in a compact and efficient manner.

2. Description of the Prior Art

Creation of new engineering drawings on cathode-ray tube (CRT) graphics terminals with the help of computer-aided design and drafting (CADD) techniques not only results in an intelligent, compact data file, but also facilitates the rapid retrieval and updating thereof to incorporate future changes. The benefits of CADD can be realized most directly in applications such as building space planning and layout, as well as electronic, automotive and aircraft structural design. However, the current practice of entering existing drawings into computer graphics systems by manual methods is costly and time-consuming.

A number of techniques have been proposed in recent years for coding facsimile transmissions to reduce bandwidth occupancy. Most such techniques rely on one-dimensional encoding of raster scan lines through observations of the coordinates of transitions between black and white light values in graphics material. For storage and transmission purposes black lengths of scan line can be encoded by the locations of the white-to-black transitions and the distances to succeeding black-to-white transitions. Such one-dimensional coding is known as run-length coding. As early as 1952 D. A. Huffman in his paper entitled "A Method for the Construction of Minimum Redundancy Codes" (*Proc. IRE, September 1952, pp. 1098-1101*) described the construction of a minimum redundancy code based on run length statistics to reduce the average number of coding bits per image.

More recently A. J. Frank has described two-dimensional coding extending over contiguous scan lines by means of which "blobs" of graphics material can be defined as a single entity in U.S. Pat. No. 4,107,648 granted Aug. 15, 1978. In the introductory section of her specification Frank describes the background of two-dimensional encoding of graphics material in considerable detail. Such description is herewith incorporated by reference into the present specification.

It is an object of this invention to encode line lengths in engineering drawings digitally by the coordinates of their start and finish picture elements and line thickness.

It is another object of this invention to provide a vector coding technique for compacting the digital storage requirements of engineering line drawings in particular and graphic images in general.

It is a further object of this invention to provide an efficient vector coding technique which extracts vector information in real time from raster-type data scanned line by line.

A specific advantage of digitization of engineering drawings is the capability of editing and amending from remote terminals.

SUMMARY OF THE INVENTION

The above and other objects and advantages of this invention are realized in a simple encoding technique using efficient apparatus. Encoding is accomplished by placing preprocessed binary scanned data, which has been thresholded and treated for noise and drop-outs, from a first scan line into a first shift register and from a second scan line into a second shift register. Data in each register are then monitored for edge transitions and the locations of such transitions on each register are compared for connectivity. Distances between oppositely sensed transitions are also monitored, effectively averaged along each line segment and coded as line thickness. Each section of a line on the image being scanned constitutes a run and a plurality of runs can be monitored along each scan line. As subsequent scan line data are piped into the second register, the previous line is transferred into the first register. Each pair of adjacent scan lines is further monitored for the position of edge-to-edge transitions, and is in turn compared in position and slope for continuations of line lengths. Each image vector, regardless of length, can be encoded by two sets of rectangular coordinates and a number representing line thickness. The number of binary digits in each coordinate is determined by the number of picture elements in a scan line, and the number of scan lines in an engineering drawing.

BRIEF DESCRIPTION OF THE DRAWING

The foregoing objects, features and advantages of the invention will be apparent from the following more detailed description of the invention read in conjunction with the accompanying drawings in which:

FIG. 2 is a block diagram including the real-time vector encoding system of this invention;

FIG. 3 is a diagram useful in the understanding of the principle of noise removal in a stream of binary scanned image data;

FIG. 4 is a diagram useful in the understanding of the principle of void filling in a stream of binary image data;

FIG. 5 is a block diagram of a circuit for accomplishing preprocessing of a stream of binary image data for noise removal and void filling;

FIG. 6 is a diagram of successive image scan lines illustrating the principle of vector encoding;

FIG. 7 is a diagram of a concatenated run of vector data;

FIG. 8 is a diagram of connected, but not concatenated, runs of vector data;

FIG. 9 is a simplified block diagram of a vector encoder according to this invention.

DETAILED DESCRIPTION

The basic steps in automatic digitizing and processing of graphic images, particularly engineering drawings, are: scanning, thresholding, encoding and storage. Scanning of the original drawing or its microfilm equivalent is required to resolve the line and character information into small picture cells, more commonly known as pixels or pels. The optical characteristic of each pel is used to control detection circuitry that generates positionally defined, e.g., by rectangular coordinates, light values in the form of gray levels. Thresholding can then be done either in hardware or software to obtain a binary, i.e., black and white, representation from the gray level picture.

Although the principles of this invention are applicable to any size drawing or section thereof, and E size drawing has been chosen by way of example for illustrative purposes.

The thresholded bit stream from a standard "E" size engineering drawing having a sight area with dimensions of 34 inches by 44 inches with a pel resolution of four thousandths inch (0.004 inch) diameter contains over 90 million bits. Each of eleven thousand scan lines (along the 44-inch dimension) contains eighty-five hundred pels (along the 34-inch dimension). The purpose of digital encoding is to convert the enormous data stream, requiring an equal volume of storage capacity, into a compact data set reduced by better than an order of magnitude from the pure pel-by-pel data set.

A variety of encoding methods is known to the prior art, such as chain-coding, line following, line thinning and message coding. Our novel vector coding arrangement improving on the Frank blob coding scheme is particularly applicable to the encoding of line drawings. Vector coding, as hereindescribed, overcomes many deficiencies of the prior art in providing additional data compaction and the following advantages:

1. Encoding in real time without intermediate data storage;
2. Encoding that yields a compact vector representation of engineering drawings which preserves line thickness; and
3. Encoding that results in a compact data set which is amenable to future revisions to the engineering drawing, e.g., deletions and addition by way of display and editing on a CRT.

Figure 1:
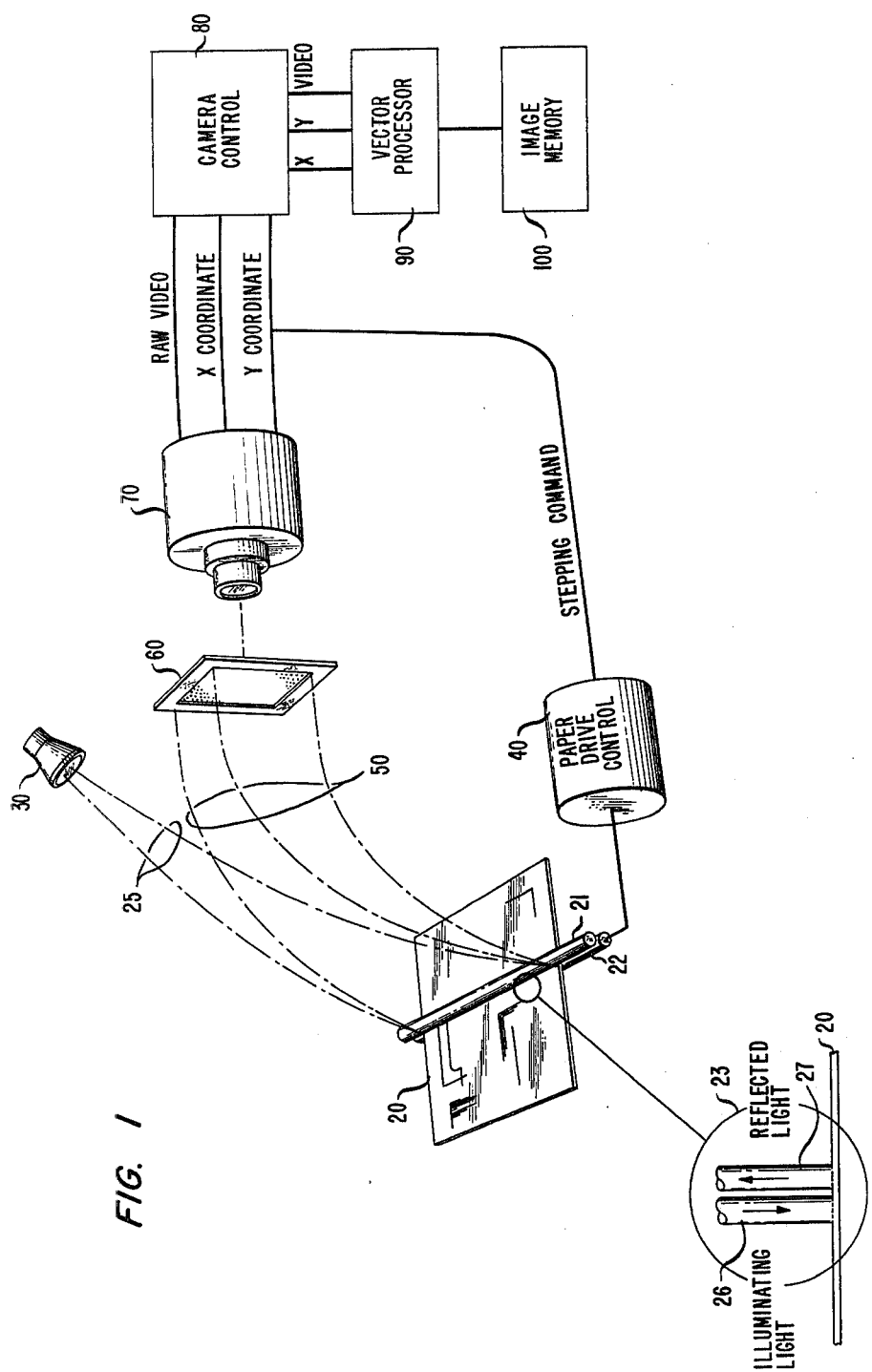
FIG. 1 represents a state-of-the art automatic digitizing system for line drawings in which this invention can be practiced.

FIG. 1 shows a state-of-the art fiber optic scanning system large enough to handle E size engineering drawings. Two bundles (25 and 50) of optical fibers are arranged in an interlaced fashion along a scan line in the direction X under which the graphics material 20 to be digitized is drawn between two friction rollers (21 and 22) stepped along in the direction Y under the control of paper drive control 40 by the amount of scan line spacing desired (0.004 inch in this example). The outer tips of the fibers in bundle 25 are illuminated by a source 30 as shown. The inner tips uniformly brighten the scan line on the graphics copy. As indicated in inset 23 light from a fiber 26 in bundle 25 is reflected by the copy into a matched fiber 27 in bundle 50. The fibers in bundle 50 are brought to a perforated rectangular mask 60 where they are positioned in the proper order for scanning. The scanning camera 70 sweeps over the 90 to 100 hole field defined by the outer tips of the fibers in bundle 50 and delivers the raw video pel information to camera control 80, as well as X-coordinate (horizontally from left to right along the scan line) and Y-coordinate (vertically from top to bottom indexing the scan line). Each succeeding Y-coordinate acts as a stepping command to paper drive control 40 at an exemplary speed of 1/30 second per step.

An optical image scanning camera, using a solid-state charge-injection device (CID), for converting scan lines to the raster form is available commercially as General Electric Model TN-2200. The mask advantageously comprises a 90×100 array of 0.001 inch diameter holes on 0.004 inch centers against which are positioned the tips of optical fibers 50. The mask is thus approximately a 0.4 inch square. The small hole diameter relative to fiber diameter permits specific identification of the light signal from each optical fiber without cross coupling.

Vector processor 90 is constructed in accordance with this invention to provide compact data for storage in image memory 100.

FIG. 2 is a functional block diagram of the vector coding of this invention against a preprocessing operation including thresholding, noise removal and void filling. The scanning function is provided by apparatus shown by way of illustration in FIG. 1. The result of the scanning operation is a line-by-line sequence of multilevel digital data streams representing gray levels of pel information from the copy being processed.

Preprocessing in broken-line block 15 illustratively comprises thresholding 11, noise removal 12 and void filling 13.

The process of thresholding 11 converts the gray level information from the scanner into binary information of one-bit per pel. The convention is chosen such that "0" represents a white pel below the chosen threshold and "1" represents a black pel equal to or above the threshold.

Noise removal 12 has to do with removing spurious and extraneous microscopic dirt spots on the copy being scanned. Void filling 13 has to do with filling in line gaps in graphics information. Minor deficiencies in the scanning and thresholding processes are also compensated by these processes. It has been found that the minimum line or symbol thickness on an engineering drawing is about 0.010 inch and the minimum separation between lines is about 0.012 inch. These measurements translate into approximately 3 pels or bits at a scanner resolution of 0.004 inch for minimum line thickness. It is therefore reasonable to assume that any run of fewer than three 1s is spurious and can safely be removed. Similarly, any gap in a run of 1s less than three bits in length can be filled in.

Noise removal is illustrated in principle in FIG. 3, where the top input line of thresholded data contains individual black runs 3, 2 and 1 bits in length. The 3-bit run is considered to be legitimate, but the 2-bit and 1-bit runs are deemed to be spurious. Consequently, the output line contains the 3-bit run, but the 2-bit and 1-bit runs have been suppressed, as indicated by the downward pointing arrows.

FIG. 4 similarly illustrates the principle of void filling. The top input line comprises mostly 1-bits suggesting a scan of a horizontal black line with 2-bit and 1-bit white runs interspersed. These short white runs are deemed to be in error and are therefore replaced in the lower output line by 1s, as indicated by the downward pointing arrows.

FIG. 5 shows a practical circuit for accomplishing the required preprocessing of scan-line data to accomplish the ends of noise removal and void filling. The preprocessor comprises AND-gate 51 to which a data stream on line 19 is applied at one input and a clock stream from a clock 52 is applied at another input; inverter 53; counters 54 and 55; and flip-flop 56. A non-return-to-zero (NRZ) output appears on lead 57. AND-gate 51 includes a conventional thresholding bias so that it goes either high or low at clock instants depending on whether the input is above or below the threshold. Should an adjustable threshold level be required, a conventional comparator can be inserted in line 19. Counters 54 and 55 are two-stage counters which overflow on the count of three and remain at this count until reset. Counter 54 is driven by high, i.e., black, inputs and counter 55, by low, i.e., white, inputs. Both counters control flip-flop 56 in such a way that its output is high when counter 54 overflows and places it in the set state, and conversely its output is low when counter 55 overflows and places it in the reset state. The outputs of counters 54 and 55 are cross-connected to reset inputs of each other whereby when one overflows, the other returns to the zero state. Thus, the output of flip-flop 56 does not change state until three black or white bits in succession are counted. Data streams on output lead 57 are of the form (after sampling) shown in FIGS. 3 and 4.

The vectoring process occurs in block 14 of FIG. 2. Here the smoothed scan line data streams, never having fewer than three bits in a given run, are operated on first, to separate runs on each scan line and, secondly, to compare runs on successive scans to see whether or not they connect. Runs are identified by edge detection, i.e., by noting the X-coordinates of transitions from white-to-black (0–1 up-transitions) and from black-to-white (1–0 down transitions) on each scan line. Upon the discovery of each such transition its digital address is stored, either temporarily or permanently depending upon whether it begins or ends a vector or measures its thickness.

For the 8500-bit scan line thickness of an E-size drawing it is apparent that the X and Y coordinates of a given pel are each a 14-bit binary number. A vector is considered to be of substantially uniform thickness, in contrast to the Frank blob, which is represented by a combination of linear codes. Accordingly, it can be identified by its start and finish coordinates, each a 14-bit number and a thickness requiring a number of bits corresponding thereto. The maximum expected line thickness is 0.040 inch or 10 pels wide and thus the thickness identifier requires four bits. Adjustments within the principles of this invention can, of course, be made should lines of greater thickness be encountered. A complete vector requires then on the order of sixty bits (28 bits for each of the start and finish coordinates and four bits for thickness) for identity regardless of length for an E-size drawing in contrast to the twenty-eight bits needed for each run on every scan line for one-dimensional encoding. Horizontal lines are encoded with start and finish coordinates on the same scan line, while thickness is measured along the normal direction to the scan line.

The next step in vectorizing after identifying up transitions in one scan line is to repeat this process for succeeding scan lines and to test prior runs with succeeding runs according to predetermined criteria. An outline of a vector comprises a number of runs of bits of the same kind on successive lines such that the leftmost edges (up transitions) are no more than a certain predetermined distance, such as three bits, apart and similarly that their rightmost edges (down transitions) are no more than the same distance apart. The distance criterion between leftmost and rightmost edges is a variable which can be selected according to the requirements of a given application to obtain an accurate reproduction of the line information in a digital data format. If the conditions described are satisfied, then the run gets associated with or connected to the same vector outline as observed on one or more previous scans. Whenever a new vector outline is started, the X and Y coordinates of one end of a new vector and the thickness thereof are taken to define the beginning of a vector.

In FIG. 6 two vector outlines are shown. Run 1 on scan line 1 belongs to a new outline and the X and Y coordinates of point $P_1$ at the left edge and the thickness are stored. Since both the left and right edges of run 1 scan lines 1 and 2 are essentially 0 pels apart (within the chosen tolerance of 3), run 1 on scan line 2 is associated with or connected to outline 1 and the number of runs in outline 1 so far is 2. A count is kept of the number of runs in each outline in preassigned memory locations. When the count equals an arbitrary fixed number, say 5, of runs, then a second set of X and Y coordinates for the point $P_2$ is stored to define the end of the vector. However, if the next vector can be associated with a previous vector by edge tolerance and slope over 5 runs, then the coordinates of point $P_2$ are replaced by the coordinates of point $P_3$.

Similarly, the beginning of run 2 on scan line 1 has the coordinates of point $Q_1$ stored, together with the thickness of run 2. Successive scans in run 2 form another vector outline and the coordinates of point $Q_2$ are stored to define the end of the second vector. The left and right edges in an actual drawing do not line up as neatly as illustrated. In this example, edge tolerances within 3 pels are considered as connectible. The thickness and line spacings in FIG. 6 are exaggerated for explanatory purposes.

FIG. 7 represents a vector outline extending substantially vertically over at least ten scan lines. This type of vector can be fully identified by the end points $P_1$ and $P_3$ and the thickness, and is said to be concatenated. The intermediate point $P_2$ need not be permanently stored.

FIG. 8 represents two vector segments that must be identified as separate vectors because the slope $P_1$–$P_2$ differs by more than a predetermined tolerance from slope $P_2$–$P_3$. These two vectors connect but cannot be associated as a single concatenated vector in consonance with the prior discussion. Curved lines are represented in this way by linear segments.

FIG. 9 is a block diagram of an encoder apparatus by means of which runs in successive scan lines of graphic copy according to this invention can be identified and compared for development of vector outlines. This encoder comprises shift registers 91 and 92, scanning control 93 and vector processor 90. Scanner 10 is assumed to include the functions of scanning per se as described in connection with FIG. 1 and preprocessing to remove noise and fill voids as described in connection with FIG. 5.

Registers AA and BB are of equal number of stages up to the number of pels in a scan line. If E size drawings are to be processed the number of stages must be at least 8500. In addition, one additional stage, initially set at zero, is provided in order to observe a possible white-to-black transition in the first pel on a scan line. Registers AA and BB can be connected in series in recursive modes by means of switches 108, 109 and 110 under control of scanning control 93. Scanning control 93 provides a sampling clock for scanner 10 and a shifting clock for registers 91 and 92 over clock bus 94, and direction of shifting control for both registers independently over leads 96 and 97 to register 91 and over leads 106 and 107 to register 92. Vector processor 90 receives bit information from registers 91 and 92 over leads 101 and 102 and interacts with scanning control 93 over leads 111 and 112 to decide whether vectors are being formed from scan to scan and transmits final coding information to image memory 100. Image memory 100 is a multiaddress memory with random access features, preferably a mass storage device, such as a floppy disc.

The operation of encoder apparatus of FIG. 9 can best be explained in connection with the flow chart of FIG. 10. Scanning control 93 operates in two modes, an input phase and a processing phase. In the input phase the contents of register BB are shifted from left to right into register AA through switches 109 and 110 while in the down position. In addition, the contents of register BB are replaced upon command from scanning control 93 from scanner 10 with the preprocessed data stream representing the succeeding scan line through switch 108 while in the down position. In the processing stage switches 108, 109 and 110 are in the up position, as shown in FIG. 9, whereby registers AA and BB are placed in a recursive, reentrant or recycling state. Initially, both registers are in the input state and cleared to zero. A scan line data stream is fed into register BB from scanner 10 through switch 108 in the down position. After filling of register BB, switches 108 and 109 are restored to the up position.

Each of registers AA and BB has associated with it a counter KA and KB, respectively, to index pel positions. The first pel is always marked as a "0" (white) so that if an up-transition to "1" (black) occurs at the first pel on a scan line it will properly be indexed as the first pel in the line then being scanned. There is also provided a counter K1 for registering the number of pels between up and down transitions, i.e., the thickness of a run of 1s along a scan line.

Figure 10:
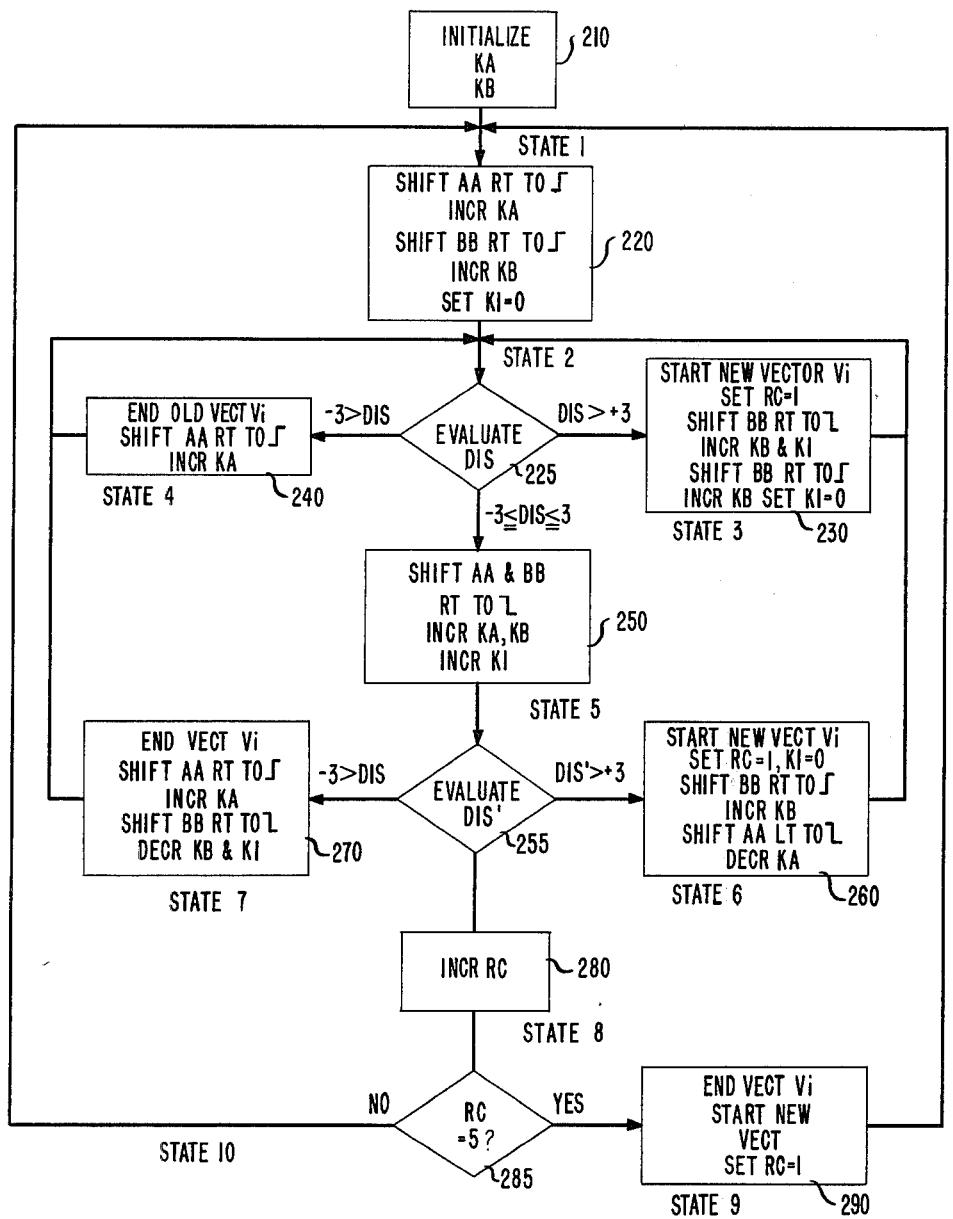
FIG. 10 is a flow chart implementing the vector encoding technique of this invention.

In STATE 1 shown in the flow chart of FIG. 10 as block 210 register BB has been filled from scanner 10 with pel information for the first scan line and register AA is all zeros. Counters KA and KB are set to zero. Register BB can be refilled with the next scan line information, since register AA would have no edge transitions to process.

Next, STATE 2 is entered, as represented by block 220. Registers AA and BB are in the reentrant condition. The pel bits in register AA are shifted right in searching for a 0–1 up transition. None is found. The pel bits in register BB are similarly shifted right. Counters KA and KB contain the X-coordinates of the observed transitions on the scan line in register BB, and these are communicated to vector processor 90 over leads 101 and 102. By subtracting these counter values, i.e., taking KA−KB=DIS, the distance or displacement DIS between these up transitions is determined in decision diamond 225. DIS is positive if the transition on the current scan line is closer to the left side of the copy than that on the prior scan line and, therefore, the vector being formed has a negative slope. DIS is positive when the vector being formed has a negative slope. DIS is zero for a vertical line.

If DIS is greater than +3, the distance criterion adopted for this illustrative embodiment, then STATE 3, as represented by block 230, is entered. There is no connection to a prior vector when the up-transition in register BB is more than 3 bits to the right of that in register AA. The X-coordinate of the beginning of a new vector $V_i$ being formed is found in counter KB. Run counter RC ($V_i$) is set to 1 (as suggested in FIG. 6). Register BB is shifted right to the down transition and counters KA, KB and K1 are incremented accordingly. The setting of counter K1 is stored as the thickness of vector $V_i$. Continue shifting register BB to the right to the next up transition to locate the next new run. Increment KB and set K1 to zero. A return is made to STATE 2 and another comparison made with the next transition in register AA.

If DIS is below −3, then STATE 4, as represented by block 240, is entered. Occurrence of this state signifies that a prior vector has been terminated and the reading of counter KA is transferred to processor 90 as the X-coordinate of the end of the vector. A return to STATE 2 now calls for a comparison of new runs on the same scan line.

If DIS is less than the value 3 in absolute terms, then a transition to STATE 5, as represented by block 250 in FIG. 10, is made. Shifts are now generated in both registers AA and BB to locate the finishing edge of the vector. Counters KA, KB and K1 are incremented accordingly to mark the X-coordinates of the finishing edges and the thickness of the vector.

DIS', the distance or displacement between the finishing edges or down transitions of connectible runs on successive scan lines, is evaluated in decision diamond 255.

Analogously to the evaluation of DIS in decision diamond 225, when DIS' is greater than +3, the indication is that the current run in BB is not connectible with the prior run in AA and therefore a new vector is being formed. The setting of counter KB is the X-coordinate of the beginning of this new vector. STATE 6, represented by block 260 is entered. The setting of counter K1 is stored as line thickness. Run counter RC is held at 1 and counter K1 is reset to zero. The run in register BB is shifted right to the next up transition and counter KB is incremented accordingly. This run in register BB is now ready to be compared with the next run on the previous scan line. Also, shift register AA to the left to the start transition and decrement counter KA accordingly for comparison with a following run in register BB.

When DIS' is more negative than −3, STATE 7, as represented by block 270, is entered. This state signifies that a vector has terminated on the previous scan line. Register AA is shifted left to the up transition to obtain the X-coordinate in counter KA for transfer to image memory 100 through vector processor 90. Register AA is shifted right to the next up transition. Counter KA is thereby incremented. At the same time register BB is shifted left to the down transition in the current scan line for comparison with the next scan line.

When DIS' is within the absolute value of 3, then the vector runs in register AA and BB connect and STATE 8, represented by block 280, is reached. Run counter RC is then incremented and the count is stored in a memory in vector processor 90 associated with the particular run.

As explained in connection with FIG. 7, the terminating X-coordinate of a run is not stored in image memory 100 until a vector spans five scan lines or terminates before that number. If run counter RC reaches five, the particular vector is terminated and the X-coordinate transferred to image memory 100 in STATE 9, represented by block 290, and run counter RC is restored to the 1 count. If run counter RC is still below the count of five, then STATE 10 is entered. In this state the running vector coordinate is held in a temporary memory in processor 90 until the next scan line is processed.

FIG. 6 of the Frank patent is illustrative of a logic circuit usable in the present invention for detecting up and down transitions in registers AA and BB. Similarly, Frank's FIG. 7 is readily adapted to computing distance values DIS and DIS' in the present invention. Frank's FIGS. 6 and 7 are incorporated herein by reference.

Registers AA and BB can be shifted simultaneously in the reentrant states when up and down transitions are being monitored. The scan lines in registers AA and BB are shifted right around the inner loop through decision diamonds 225 and 255 until all up and down transitions have been compared, connected, terminated on a prior line or initiated on the current line. Thereafter, the outer loop through STATE 1 is traversed. The prior scan line in register AA is replaced by the current scan line in register BB and a new scan line is applied to register BB. The flow chart of FIG. 10 is traversed by the nth and (n+1)st scan lines.

In another decision diamond (not shown) the state of the KA counter is monitored with respect to scan line length so that a new scan line is started and the contents of register BB are shifted to register AA.

After all scan lines of a given image have been processed, image memory 100 will have stored in sequence the beginning and ending X-coordinates for each vector for each scan line Y-coordinate and an additional number representing line thickness. In an E size drawing containing 8500 pels for each of 11000 scan lines each transition is identified by a Y (scan line) coordinate containing fourteen bits and an X (horizontal) coordinate containing another fourteen bits. A vector regardless of length is identified by starting and finishing XY-coordinate pairs and a thickness dimension. Each thickness judged to be a maximum of about ten pels and thus an allocation of four bits for the thickness dimension is adequate. Greater thicknesses can, of course, be accommodated within the principles of this invention. Accordingly, each vector can be identified by 60 bits. It has been found that with the described vector coding the 90,000,000 bits required to digitize a typical E-size drawing with a full line-by-line raster scan can be vector encoded according to this invention with only 2,500,000 bits, a compaction ratio of 36 to 1.

An ordered assemblage of vectors can be used to define a recurring geometric figure, such as a triangle, square or rectangle, and also complete alphanumeric characters or symbols. Such assemblages can be stored in RAMs as words in a dictionary. Each alphanumeric character has been found to require on the average about five vectors, i.e., straightline segments. Each component vector is described as previously discussed by specifying coordinates of vector ends and line thickness. By isolating character islands (white areas), and using a suitable character recognition algorithm, characters can be recognized from each set of vectors. Character recognition allows the different ones to be encoded in ASCII (American Standard Code for Information Interchange) numeric bytes with location coordinates, thereby further enhancing the compaction ratio to as high as 180.

A further application of vector coding is to display and edit the graphic information data file. Correction of the vector set for any possible error due to the digitization can be accomplished remotely because the coordinates with respect to the upper left of the drawing are known for each encoded vector. Curved lines are encoded as linear segments.

While this invention has been shown and described by a particular illustrative embodiment using an E size drawing, many modifications, including changes in drawing size or sectioning of a drawing, can be implemented by those skilled in the art without departing from the spirit and scope of the following claims.

We claim:

1. Apparatus for encoding line vectors from raster digital data defining light intensities of two-dimensional line drawings, said raster including a plurality of scan lines each containing a fixed number of picture elements comprising first and second register means for storing transition data between picture elements of unlike light intensity from consecutive pairs of scan lines, means for comparing the contents of said first and second registers to determine from the matching occurrence of like transitions along such consecutive scan lines whether or not line vectors are present, and means for generating and storing in additional registers numerical coordinates of start and finish picture elements of connectible vectors by scan line order and picture element position along a scan line from a raster edge together with a thickness factor.

2. Apparatus for encoding line vectors as defined in claim 1 in which said first and second registers comprise a plurality of stages capable of storing for each transition occurring in a scan line a first plurality of binary digits indexing the distance of the picture element from a first border of the scanned drawing, a second plurality of binary digits indexing the scan line order from a second border thereof perpendicular to said first border, and a third plurality of binary digits proportional to the displacement between oppositely directed transitions defining the thickness of a run of picture elements of like light intensity.

3. Apparatus for encoding line vectors as defined in claim 1 further comprising means for thresholding scan line data covering a grayness range into single binary digits treated as black or white only for each picture element and means for suppressing runs of scan line data of like intensity and of lesser length than a predetermined number whereby probable spurious data of less than line thickness are eliminated.

4. Apparatus for encoding line vectors as defined in claim 1 further comprising means for determining whether vector thickness along a scan line is less than or greater than the least permissible line thickness in number of scanned picture elements.

5. Apparatus for encoding line vectors as defined in claim 1 further comprising first means for examining vectors for connectivity in segments over a fixed number of scan lines in each run, and second means for examining vectors for connectivity over indefinite lengths.

6. Apparatus for encoding linear vectors from raster data defining the picture elements of two-dimensional line drawings in which a raster includes a plurality of lines parallel to one border thereof with a predetermined number of picture elements each, first and second shift registers connectable in the alternative in series relationship in an input mode and individually reentrant in a processing mode, a scanning controller, a vector processor and an image memory further comprising means for entering scan line data from pairs of successive scan lines consecutively into said first and second shift registers in said input mode, means for matching transitions between binary data states defining vector edges on consecutive pairs of adjacent scan lines in said processing mode in accordance with counts of distances from a second border normal to said one border within tolerances of a predetermined number of picture elements from said one border to the opposite parallel border over a complete raster scan as scan line data are circulated back and forth through said first means by means of said controller, first means for inserting into said image memory the coordinates encoded as counts along each scan line from said second border as a reference and the order of the scan line of the start of each connectible vector together with the number of picture elements between transitions of opposite type therealong, and second means for entering into said image memory the coordinates of the finish of each vector measured from said second border and the order of the scan line, each vector being matched from scan line to scan line to determine that matching edges are within a predetermined tolerance.

7. Apparatus for encoding linear vectors as defined in claim 6 further comprising means for converting multi-digit scan line data to binary form by thresholding at an intermediate light intensity whereby each picture element is identifiable by a single binary digit, and means for screening said binary converted data for short runs of either binary digit whereby noise bits and voids of fewer elements than minimal line thickness are suppressed.

8. Apparatus for encoding linear vectors as defined in claim 7 in which said screening means further comprises first and second binary counters having an overflow output at said short run length and inputs of normal and inverted data respectively, and a bistate flip-flop driven by the overflow outputs of said first and second counters such that the output of the flip-flop remains high as long as said first counter is in an overflow state and low as long as said second counter is in an overflow state, an overflow state in one counter causing a return to a reference state in the other counter.

9. Apparatus for encoding linear vectors as defined in claim 6 further comprising first means for comparing consecutive up-transitions on adjacent scan lines to determine tolerances therebetween by subtracting their respective index counts, and second means for comparing consecutive down-transitions on adjacent scan lines to determine tolerances therebetween by subtracting their respective index counts, those vectors whose up- and down-transitions are within tolerance being connectible vectors, those vectors out of tolerance being either terminated on the earlier scan line or taken as new vectors on the latest scan line according to the polarity of the differences between transition indices on succeeding scan lines.

* * * * *